United States Patent
Aoki

(10) Patent No.: US 10,027,241 B2
(45) Date of Patent: Jul. 17, 2018

(54) VEHICLE-MOUNTED POWER CONVERSION DEVICE

(71) Applicant: MEIDENSHA CORPORATION, Tokyo (JP)

(72) Inventor: Junichi Aoki, Fuji (JP)

(73) Assignee: MEIDENSHA CORPORATION, Tokyo (JP)

( * ) Notice: Subject to any disclaimer, the term of this patent is extended or adjusted under 35 U.S.C. 154(b) by 284 days.

(21) Appl. No.: 14/787,886

(22) PCT Filed: Apr. 25, 2014

(86) PCT No.: PCT/JP2014/061676
§ 371 (c)(1),
(2) Date: Oct. 29, 2015

(87) PCT Pub. No.: WO2014/178342
PCT Pub. Date: Nov. 6, 2014

(65) Prior Publication Data
US 2016/0105123 A1 Apr. 14, 2016

(30) Foreign Application Priority Data

Apr. 30, 2013 (JP) ................................. 2013-094924

(51) Int. Cl.
*B60L 1/00* (2006.01)
*H02M 7/00* (2006.01)
(Continued)

(52) U.S. Cl.
CPC ............. *H02M 7/003* (2013.01); *H02M 7/44* (2013.01); *H05K 7/1432* (2013.01)

(58) Field of Classification Search
CPC ....... H02M 7/003; H02M 7/44; H05K 7/1432
(Continued)

(56) References Cited

U.S. PATENT DOCUMENTS 6,621,701 B2 9/2003 Tamba et al.
6,661,659 B2 12/2003 Tamba et al.
(Continued)

FOREIGN PATENT DOCUMENTS

JP 2000-60145 A 2/2000
JP 2002-238264 A 8/2002
(Continued)

OTHER PUBLICATIONS

Canadian Office Action, dated Jun. 1, 2017, 5 pages.
Extended European Search Report, dated Nov. 21, 2016, 7 pages.

*Primary Examiner* — Jared Fureman
*Assistant Examiner* — Duc M Pham
(74) *Attorney, Agent, or Firm* — Foley & Lardner LLP

(57) ABSTRACT

A vehicle-mounted power conversion device including: a capacitor for smoothing DC voltage; a power module for converting the smoothed DC voltage into AC voltage; a control substrate provided with a connector for a harness; a power module substrate provided with a connector for a harness; a harness connected to the control substrate at one end and connected to the power module substrate at the other end, thereby connecting the control substrate and the power module substrate electrically; and a case and cover for housing the capacitor, the power module, the control substrate, the power module substrate and the harness. In this device, a housing space defined between the case and cover is an integrated space, and a divided position between the case and cover is located further toward bottom wall of the case than the connector of the control substrate and the connector of the power module substrate.

2 Claims, 4 Drawing Sheets

(51) Int. Cl.
*H05K 7/14* (2006.01)
*H02M 7/44* (2006.01)

(58) Field of Classification Search
USPC .......................................................... 307/10.1
See application file for complete search history.

(56) References Cited

U.S. PATENT DOCUMENTS

| | | | |
|---|---|---|---|
| 2003/0067748 A1* | 4/2003 | Tamba | H05K 7/20927 361/699 |
| 2010/0319976 A1 | 12/2010 | Nakai et al. | |
| 2011/0222244 A1* | 9/2011 | Takashiro | H02M 7/003 361/704 |
| 2011/0259890 A1 | 10/2011 | Hsu | |
| 2011/0310585 A1* | 12/2011 | Suwa | H05K 7/20927 361/820 |
| 2013/0062724 A1* | 3/2013 | Tokuyama | H05K 7/1432 257/499 |
| 2013/0128643 A1 | 5/2013 | Shinohara et al. | |

FOREIGN PATENT DOCUMENTS

| | | |
|---|---|---|
| JP | 2003-116282 A | 4/2003 |
| JP | 2009-189187 A | 8/2009 |
| JP | 2012-5323 A | 1/2012 |
| JP | 2012-191766 A | 10/2012 |
| JP | 2012-249483 A | 12/2012 |

* cited by examiner

VEHICLE-MOUNTED POWER CONVERSION DEVICE

TECHNICAL FIELD

The present invention relates to a vehicle-mounted power conversion device.

BACKGROUND OF THE INVENTION

As a conventional example of vehicle-mounted power conversion devices, Patent Document 1 has been known. A cabinet of a vehicle-mounted power conversion device used in Patent Document 1 is divided into two parts, i.e., a first cabinet 1 located at a lower position and a second cabinet 2 located at an upper position.

In the housing space of the first cabinet 1, a power module 3 and a capacitor 4 are housed. At a part above the power module 3 and the capacitor 4, a bus bar 5 and a power module substrate 6 are disposed. The second cabinet 2 defines an upper housing space and a lower housing space with a partition wall 2a, and the above-mentioned bus bar 5 and the power module substrate 6 are housed in the lower housing space of the second cabinet 2. In the upper housing space of the second cabinet 2, a control substrate 7 is disposed. The control substrate 7 is connected to the power module substrate 6 disposed in the lower housing space of the second cabinet 2, through a harness (not shown illustrated) provided piercing through a through hole 2b formed in the partition wall 2a.

REFERENCES ABOUT PRIOR ART

Patent Documents

Patent Document 1: Japanese Patent Application Publication No. 2012-005323

SUMMARY OF THE INVENTION

In recent years, the field of vehicle-mounted power conversion device is on a trend toward automatic fabrication. In general, however, connection of a harness is performed by hand of human.

In the case of producing a vehicle-mounted power conversion device having a structure of Patent Document 1, in the step of connecting the control substrate 7 and the power module substrate 6 through the harness (not shown), it is necessary to previously connect the harness to the power module substrate 6 and then draw the harness through the through hole 2b of the partition wall 2a thereby to move the other end of the harness into the upper housing space.

Accordingly, it is required to manually carry out a series of operations involving: connecting one end of the harness to the power module substrate 6; moving the other end of the harness into the upper housing space in such a manner as to draw the other end of the harness through the through hole 2b of the partition wall 2a; mounting the control substrate 7 in the upper housing space of the second cabinet 2; and then connecting the other end of the harness to the control substrate 7. Thus, smooth automatic fabrication becomes difficult.

In addition, the harness must be drawn through the through hole 2b formed in the partition wall 2a of the second cabinet 2, which is therefore not good in workability and may cause a fear of impairing the harness at the time of drawing it through the through hole 2b.

Furthermore, also concerning the time of disassembling the vehicle-mounted power conversion device, it is necessary to disconnect the harness from the control substrate 7 and then move the other end of the harness from the upper housing space to the lower housing space in such a manner as to pull out the harness through the through hole 2b of the partition wall 2a and then detach the second cabinet 2, which has caused a problem of extra effort. Although the general vehicle-mounted power conversion device is often configured by providing two upper and lower lids (the first cabinet 1 and a lid) in a single cabinet (the second cabinet 2), the case of this configuration requires a work space for the insertion and extraction of the harness between the second cabinet 2 and an inner part, which has brought about a problem of increasing the size of the vehicle-mounted power conversion device.

In view of the above, an object of the present invention is to facilitate the automatic fabrication of the vehicle-mounted power conversion device, to prevent the harness from damage, and to reduce the size of the device.

The present invention is devised in view of the above-mentioned conventional problems. An aspect of the present invention resides in a vehicle-mounted power conversion device comprising: a capacitor for smoothing DC voltage; a power module for converting the smoothed DC voltage into AC voltage; a control substrate provided with a connector for connecting a harness and capable of outputting a control pulse on the basis of various input signals; a power module substrate provided with a connector for connecting a harness and capable of outputting a driving pulse to the power module on the basis of the control pulse; a harness connected to the connector of the control substrate at one end and connected to the connector of the power module substrate at the other end, thereby connecting the control substrate and the power module substrate electrically; and a case and cover for housing the capacitor, the power module, the control substrate, the power module substrate and the harness. In this device, a housing space defined between the case and the cover is an integrated single space, and a divided position between the case and the cover is located further toward a bottom wall of the case than the connector of the control substrate and the connector of the power module substrate.

According to the present invention, it becomes possible to facilitate the automatic fabrication of the vehicle-mounted power conversion device while preventing the harness from damage and reducing the size of the device.

MODE(S) FOR CARRYING OUT THE INVENTION

Figure 1:
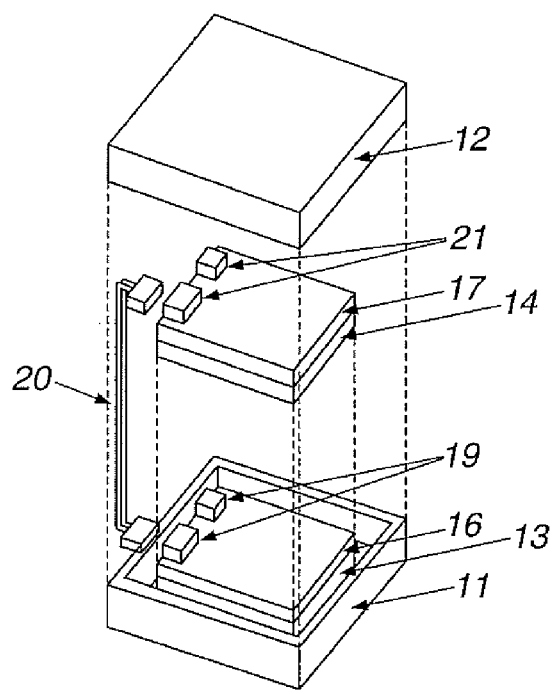
FIG. 1 An exploded perspective view of an embodiment of a vehicle-mounted power conversion device.
Figure 2:
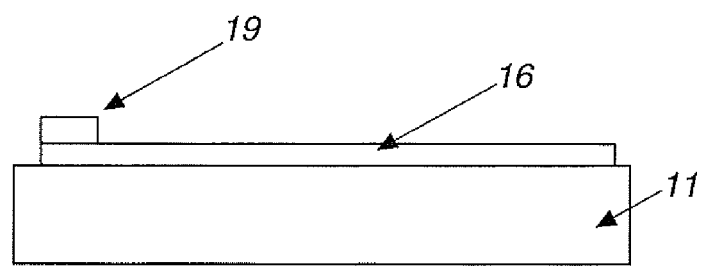
FIG. 2 A side view showing a state where a power module and a power module substrate are housed in a case.
Figure 3:
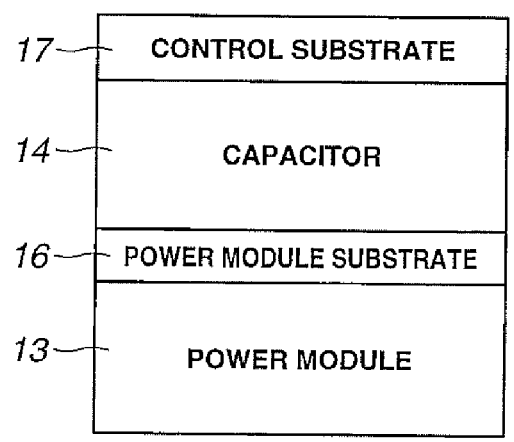
FIG. 3 A model diagram showing the order of stacking components to be housed in the case and a cover.

Referring now to FIGS. 1 to 3, an embodiment of a vehicle-mounted power conversion device according to the present invention will be explained in detail.

[Embodiment]

A schematic view of an embodiment of a vehicle-mounted power conversion device is shown as FIG. 1. As shown in FIG. 1, a housing for the vehicle-mounted power conversion device is constituted of a case 11 and a cover 12. The case 11 is formed having a bottom wall and a peripheral wall surrounding four sides of the bottom wall and having a substantially rectangular shape in a plan view in which the upper surface is open upward. The cover 12 is formed having a top wall and a peripheral wall surrounding four sides of the top wall and having a substantially rectangular shape in plan view in which the lower surface is open downward, so as to be able to close the upper opening of the case 11.

In the housing space between the case 11 and the cover 12, in order from the bottom wall of the case 11, a power module 13, a power module substrate 16, a capacitor 14 and a control substrate 17 are stacked and accommodated.

The power module 13 is, for example, provided with series circuit 3-phase upper and lower arms including a semiconductor switching element and the diode of the IGBT or the like which operates as an upper arm and a semiconductor switching element and the diode of the IGBT or the like which operates as a lower arm, thereby constituting a three-phase voltage-type inverter. The three-phase voltage-type inverter is an example of the power module 13 and may have other configurations.

The power module substrate 16 is the so-called drive circuit. The power module substrate 16 is provided with connectors 19 at one side of the outer peripheral edge. To the connectors 19, one end of a harness 20 for electrically connecting the power module substrate 16 and the control substrate 17 is connected.

The capacitor 14 is provided to include: a capacitor main body covered with non-conductive materials such as resin; positive and negative power supply terminals (not shown); and positive and negative capacitor terminals. DC power is supplied to the capacitor 14 from the positive and negative power supply terminals through a connector (not illustrated) and the like thereby electrically connecting the capacitor 14 to the power module 13 through the positive and negative capacitor terminals.

The control substrate 17 is composed of: a substrate formed of a non-conductive material, the both surfaces of which are formed with a wiring pattern (not shown); and various electronic components mounted thereon, such as a microcomputer (not illustrated). The control substrate 17 is provided with connectors 21 at one side of the outer peripheral edge. To the connectors 21, the other end of the harness 20 for electrically connecting the power module substrate 16 and the control substrate 17 is connected.

The harness 20 is provided to electrically connect the power module substrate 16 to the control substrate 17, in which transmission and reception of various signals are performed.

In such a configuration, the DC voltage is smoothed in the capacitor 14 and converted into AC power by the power module 13 (e.g. a three-phase voltage-type inverter), and then supplied to a load such as a motor (not illustrated), for example.

Into the control substrate 17, for example, signals such as a target torque value for the motor, a current value outputted from the power module 13, and a magnetic pole position of a motor rotor are inputted. The control substrate 17 outputs a control pulse into the power module substrate 16 on the basis of the input signals. The power module substrate 16 outputs a driving pulse on the basis of the control pulse to the power module 13 thereby controlling the semiconductor switching element.

FIG. 2 is a side view showing a state where the power module 13 and the power module substrate 17 are housed in the case 11. As shown in FIG. 2, the present embodiment of the vehicle-mounted power conversion device is so constructed that a divided position between the case 11 and the cover 12 is located lower than the connectors 21 of the control substrate 17 and the connectors 19 of the power module substrate 16 disposed inside the case 11 and the cover 12.

FIG. 3 is a model diagram showing the order of stacking components to be housed in the case 11 and the cover 12. As shown in FIG. 3, in order from the bottom wall of the case 11, the power module 13, the power module substrate 16, the capacitor 14 and the control substrate 17 are stacked in this order and accommodated in an integrated single space defined by the case 11 and the cover 12.

As discussed above, since the interior of the housing space defined between the case 11 and the cover 2 is provided in the form of an integrated single space while the case 11 and the cover 12 are divided at a position lower than the connectors 21 of the control substrate 17 and the connectors 19 of the power module substrate 16, it becomes possible to connect the harness 20 to the connectors 19 and the connectors 21 after mounting all of the inner parts such as the power module substrate 16 in a condition where the cover 12 is detached. Consequently, automatic fabrication except for connection of the harness 20 becomes feasible. Moreover, an operation of attaching or detaching the harness 20 is performed without being restricted in workspace by the case 11 and the cover 12, so that the attaching or detaching operation becomes facilitated.

Additionally, an operation of disassembling the vehicle-mounted power conversion device is improved in workability because it becomes possible to easily access the inner parts only by removing the cover 12.

Furthermore, by dividing the case 11 and the cover 12 at a position further toward the bottom wall of the case 11 than the connectors 21 of the control substrate 17 and the connectors 19 of the power module substrate 16, it becomes possible to connect the harness 20 with ease after mounting the other inner parts. With this, an operation to previously connect the harness 20 to the power module substrate 16 may be omitted.

In addition, the harness 20 is not required to be drawn through the through hole 2b so that the handling of the harness 20 is easy, and therefore it becomes possible to prevent the harness 20 from damages.

Figure 4:
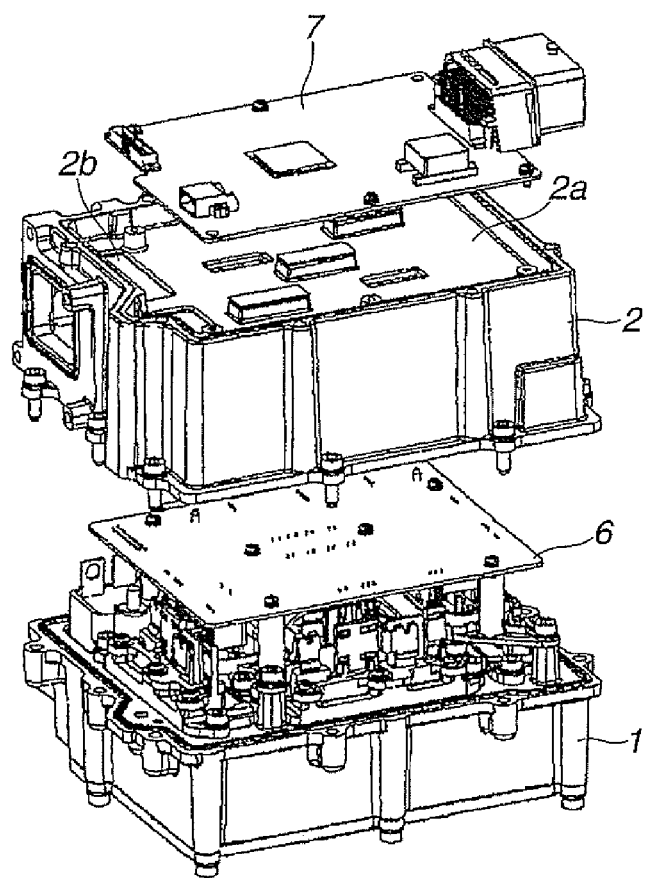
FIG. 4 An exploded perspective view of a conventional vehicle-mounted power conversion device.
Figure 5:
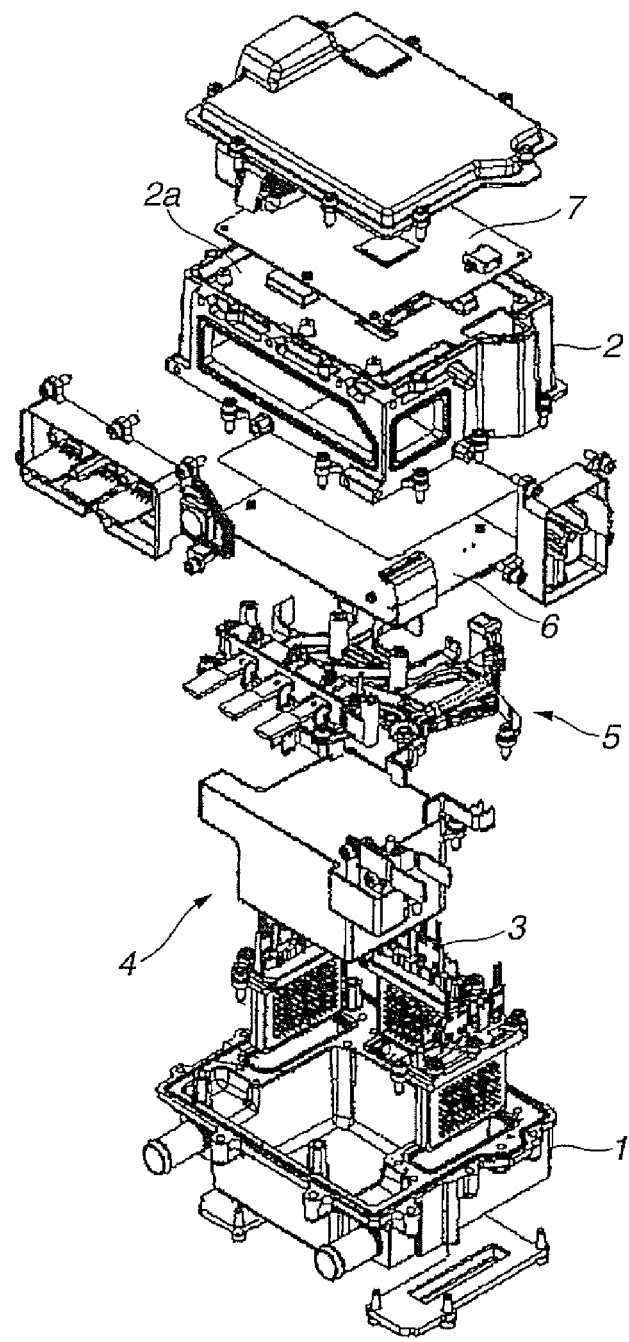
FIG. 5 An exploded perspective view of a conventional vehicle-mounted power conversion device.

Moreover, at the time of disassembling the vehicle-mounted power conversion device, it is not necessary to disconnect the harness 20 when removing the cover 12, on the contrary to conventional examples (FIGS. 4 and 5). An extra space for disconnecting the harness 20 from the connectors 19 and 21 may be omitted from the case 11 and the cover 12, so as to be able to reduce the size of the vehicle-mounted power conversion device.

Although the present invention has been described above by reference only to the above-mentioned embodiment, various modifications and variations in the scope of the technical idea of the present invention will occur to those skilled in the art, and such variations and modifications are within the scope of the claims as a matter of course.

For example, although the above-mentioned embodiment was explained by reference to a specified vehicle-mounted power conversion device as an example, any vehicle-mounted power conversion device equipped with the power module 13, the power module substrate 16, the capacitor 14, the control substrate 17 and the harness 20 is applicable.

The invention claimed is:

1. A vehicle-mounted power conversion device comprising:
   a capacitor for smoothing DC voltage;
   a power module for converting the smoothed DC voltage into AC voltage;
   a control substrate provided with a connector for connecting a harness and capable of outputting a control pulse on the basis of various input signals;
   a power module substrate provided with a connector for connecting a harness and capable of outputting a driving pulse to the power module on the basis of the control pulse;
   a harness connected to the connector of the control substrate at one end and connected to the connector of the power module substrate at the other end, thereby connecting the control substrate and the power module substrate electrically; and
   a case and cover for housing the capacitor, the power module, the control substrate, the power module substrate and the harness,
   wherein a housing space defined between the case and the cover is an integrated single space, the power module substrate and the control substrate are housed in the integrated single space of the case and the cover, and
   a divided position between the case and the cover is located further toward a bottom wall of the case than the connector of the control substrate and the connector of the power module substrate.

2. The vehicle-mounted power conversion device as claimed in claim 1, wherein, in the integrated single space of the case and the cover, the power module, the power module substrate, the capacitor and the control substrate are housed and stacked in this order from the bottom wall of the case.

* * * * *